(12) United States Patent
Wang et al.

(10) Patent No.: US 12,366,540 B2
(45) Date of Patent: Jul. 22, 2025

(54) DEVICE AND METHOD FOR MEASURING CORRELATION BETWEEN FATIGUE PERFORMANCE AND MICROSTRUCTURE OF ONE-DIMENSIONAL (1D) NANOMATERIAL IN SITU IN TRANSMISSION ELECTRON MICROSCOPE (TEM)

(71) Applicant: Beijing University of Technology, Beijing (CN)

(72) Inventors: Lihua Wang, Beijing (CN); Yan Ma, Beijing (CN); Xiaodong Han, Beijing (CN)

(73) Assignee: Beijing University of Technology, Beijing (CN)

( * ) Notice: Subject to any disclaimer, the term of this patent is extended or adjusted under 35 U.S.C. 154(b) by 498 days.

(21) Appl. No.: 17/990,962

(22) Filed: Nov. 21, 2022

(65) Prior Publication Data
US 2024/0035988 A1  Feb. 1, 2024

(30) Foreign Application Priority Data

Jul. 28, 2022 (CN) .......................... 202210898463.9

(51) Int. Cl.
*G01N 23/06* (2018.01)
*B82Y 35/00* (2011.01)
*H01J 37/26* (2006.01)

(52) U.S. Cl.
CPC .............. *G01N 23/06* (2013.01); *H01J 37/26* (2013.01); *B82Y 35/00* (2013.01)

(58) Field of Classification Search
CPC .......... G01N 23/06; H01J 37/26; B82Y 35/00
See application file for complete search history.

(56) References Cited

U.S. PATENT DOCUMENTS

2021/0047536 A1* 2/2021 Chang ....................... C09B 1/00

* cited by examiner

Primary Examiner — Wyatt A Stoffa
Assistant Examiner — Hanway Chang
(74) Attorney, Agent, or Firm — CARTER, DELUCA & FARRELL LLP

(57) ABSTRACT

The present disclosure provides a device and method for measuring a correlation between fatigue performance and a microstructure of a one-dimensional (1D) nanomaterial in situ in a transmission electron microscope (TEM), belongs to the technical field of in-situ testing and characterization of microstructures of nanomaterials. The device includes a chip part, a supporting part, and a control circuit. The supporting part is a bracket and a cable disposed on a transmission sample holder, and the circuit part consists of cables connected to the chip and a power supply capable of applying different waveforms, variable voltages, and variable frequencies. This design breaks through a traditional mechanical stress-driven fatigue performance test method, and achieves controllable adjustment of different amplitudes and cycles by using an electric field formed by a voltage and adjusting a voltage size and frequency, such that the 1D nanomaterial vibrates in the electric field to achieve fatigue performance testing.

9 Claims, 2 Drawing Sheets

DEVICE AND METHOD FOR MEASURING CORRELATION BETWEEN FATIGUE PERFORMANCE AND MICROSTRUCTURE OF ONE-DIMENSIONAL (1D) NANOMATERIAL IN SITU IN TRANSMISSION ELECTRON MICROSCOPE (TEM)

CROSS REFERENCE TO RELATED APPLICATION

This patent application claims the benefit and priority of Chinese Patent Application No. 202210898463.9, filed with the China National Intellectual Property Administration on Jul. 28, 2022, the disclosure of which is incorporated by reference herein in its entirety as part of the present application.

TECHNICAL FIELD

The present disclosure relates to a device and method for studying fatigue performance and a microstructure of a one-dimensional (1D) nanomaterial in a process of long-cycle fatigue loading at an atomic scale in situ in a transmission electron microscope (TEM). The present disclosure belongs to the technical field of in-situ testing and characterization of microstructures of nanomaterials.

BACKGROUND

In the past decades, with the rapid development of nanoscience and nanotechnology, the application of 1D nanomaterials (nanowires, nanotubes, and nanopillars, etc.) in micro-nano electromechanical devices has attracted more and more attention. Due to the excellent performance, the 1D nanomaterials can be used as key components of nanodevices, nanomechanics, and micro-nano electromechanical systems. In practical applications, the fatigue resistance and structural stability of the 1D nanomaterials under external forces are critical to the stable output of device performance. For example, 1D devices and wires in flexible electronic devices will be under stress-strain state for a long time. The fatigue performance and corresponding structural stability of these 1D nanomaterials may directly affect their mechanical, optical and thermal performance under long-cycle stress and strain. Therefore, it is very important for the practical application, detection and design of nanodevices to in situ test fatigue performance of 1D nanowires and study the microstructure evolution mechanism. However, due to the limitation of experimental technology, there are relatively few in-situ studies on the correlation between fatigue performance and a microstructure of the 1D nanowires. In addition, the 1D nanomaterials have a small size and a large specific surface area, and their plastic deformation and fracture mechanisms under a long-term fatigue state are largely different from those of traditional bulk materials, which also brings new opportunities for the discovery of new phenomena.

The traditional fatigue performance test of materials is usually realized by cyclic stress loading of samples with mechanical devices, which is applicable to large bulk materials. Due to the small size, the 1D nanomaterials are easy to deform and fracture under external forces, and are hard to transfer or fix at both ends during testing, all of which make it extremely difficult to measure the fatigue performance of nanomaterials using mechanical devices. More importantly, through the traditional mechanical device test, only the fatigue performance of materials can be obtained, and the structural evolution of materials in the fatigue process cannot be observed in situ simultaneously, thus losing the information on the microstructure evolution of materials under cyclic stress. As a result, the studies on the behavior of structural evolution of materials in a fatigue application state rely heavily on ex situ observation or computer simulation, and it is extremely difficult to accurately establish the correlation between the fatigue performance and microstructure of materials. Therefore, it is very important to develop an in-situ test method that can simultaneously realize the fatigue performance measurement of the 1D nanomaterials and their microstructure evolution at the atomic scale.

In view of the above technical difficulties, this method takes a new approach and uses an electric field force as the driving force of the fatigue test, which can effectively test the fatigue performance of small-sized 1D nanomaterials and in situ observe the microstructure evolution at the atomic scale during the fatigue test. This method can control the stress, strain frequency number and frequency, so as to accurately measure the fatigue performance of the 1D nanomaterials. The present disclosure combines the lithography technology and focused ion beam (FIB) technology to prepare a miniature fatigue test device. By placing the device in the TEM, during the fatigue test of the 1D nanomaterials, the structural response of the 1D nanowires at the atomic scale during the test can also be observed in situ to establish the correlation between the fatigue performance and the microstructure of the 1D nanomaterials.

This new device and test method can provide quantitative details of fatigue performance and microstructure evolution of the 1D nanomaterials under conditions of high-frequency and long-cycle stress and strain. This method is of great significance for revealing the deformation mechanism of the 1D nanomaterials under the conditions of long-cycle and high-frequency stress and strain, and establishing the correlation between the fatigue performance and microstructure. It is helpful to understand the application and behavior of failure of 1D nanomaterial devices, flexible devices and micro-nano electromechanical systems, and guide the design and synthesis of nanomaterials with excellent fatigue performance.

SUMMARY

According to the above background, the present disclosure provides a device that can measure fatigue performance under conditions of long-cycle and high-frequency stress and strain and in situ observe a microstructure evolution process of a 1D nanomaterial in a fatigue test in a TEM. The present disclosure uses an electric field force as a driving force, such that the 1D nanomaterial can move with long-cycle and high-frequency under the influence of the electric field force, and the fatigue performance of the material can be accurately obtained through calculation. In addition, the present disclosure uses the lithography technology and FIB technology to build a micro test device, such that the microstructure evolution of atomic scale in the fatigue process can be observed by the TEM during the fatigue test. The present disclosure makes it possible to test the fatigue performance of the 1D nanomaterial with extremely small size, and the evolution of the microstructure of the 1D nanomaterial during the test can also be observed in situ to establish the correlation between the fatigue performance and microstructure of the 1D nanomaterial.

The present disclosure adopts the chip lithography technology to prepare windows, wires, and plates on small silicon wafers, and carries them on in-situ sample holder of the TEM. A single 1D nanomaterial (a nanowire, nanopillar, or nanotube) is transferred to the chip using the FIB technology. In the TEM, a frequency controlled alternating current (AC) is applied to the chip capacitor plate to achieve the high-frequency vibration of the 1D nanomaterial in an AC field. The 1D nanomaterial will be deflected under the force in a parallel unidirectional electric field. The AC electric field formed between the plates will change the direction of the force on the 1D nanomaterial placed in them with the change of the electric field direction, so as to achieve high-frequency vibration of the 1D nanomaterial. The vibration frequency is equal to the applied AC frequency. Based on the above theoretical basis, the present disclosure can obtain conditions for long-cycle and high-frequency stress and strain of the 1D nanomaterial, and calculate the fatigue performance according to the vibration frequency. More importantly, the fatigue response of the atomic scale microstructure of the 1D nanomaterial can be observed in situ in the TEM, and the correlation between the fatigue performance and the microstructure can be obtained.

1. A device for measuring a correlation between fatigue performance and a microstructure of a 1D nanomaterial in situ in a TEM includes: a chip part, a supporting part, and a control circuit. The chip part includes a P-type silicon-on-insulator (SOI) wafer, an insulating layer, a wire, a plate, and an observation window. The supporting part is a carrier disposed in a front section of a sample holder of the TEM, and is configured to carry the chip part and connecting cables. The control circuit includes a connecting line led out from the sample holder of the TEM and an external power supply.
2. Further, the P-type SOI wafer includes three layers: a surface silicon device layer, a middle buried oxygen layer, and a bottom silicon substrate layer. A thickness of the silicon device layer ranges from 10 to 100 μm. A thickness of the buried oxygen layer ranges from 100 to 1,000 nm. A thickness of the silicon substrate layer ranges from 200 to 1,000 μm.
3. Further, the insulating layer is a silicon dioxide insulating layer with a thickness of 100-1,000 nm formed on a surface of the silicon device layer on an upper layer of the SOI wafer using thermal oxidation process.
4. Further, the wire is formed by metal sputtering on a surface of the insulating layer and lithographic stripping.
5. Further, the chip plate is formed by metal sputtering on a surface of the insulating layer, has a thickness ranging from 2 to 10 μm, and is lithographically stripped to a minimum line width range of 10-100 μm.
6. Further, the chip observation window is a rectangular through hole penetrating the SOI wafer in a thickness direction, and has a long side with a size equal to a length of the chip plate and a width range of 5-100 μm.
7. Further, the connecting cables include an external cable connected to the chip and a cable connected to the sample holder of the TEM.
8. Further, the to-be-tested material is a nanowire, nanopillar, or nanotube, is made of metal or a semiconductor, and has a diameter range of 10-200 nm and a length range of 10-100 μm.
9. A method using the device includes: carrying a to-be-tested material using an FIB microscope, where during transfer, an ion beam is not used for observation of a sample, so as to prevent damage to the to-be-tested material; and conducting an in-situ test in the TEM, applying a voltage with a required waveform, voltage, and frequency using the external power supply, and in situ observing microstructure evolution of the sample under fatigue.

To achieve the above objective, the present disclosure is achieved by the following technical solutions:

The device and method for measuring a correlation between fatigue performance and a microstructure of a 1D nanomaterial in situ in a TEM is provided. The device includes: the chip part, the supporting part, and the control circuit. The chip part is made of a P-type SOI wafer. The silicon device layer has a thickness of 10-100 μm. The buried oxygen layer is silicon oxide with a thickness of 1-10 μm. The substrate has a thickness of 200-1,000 μm. First, thermal oxidation treatment is conducted on the surface device layer of the silicon wafer to form the surface insulating layer of silicon dioxide. A rectangular observation window with a side length of 500 μm is etched at a back center of the silicon wafer. An etching thickness is a thickness of the substrate layer of the selected SOI wafer, and the device layer and the buried oxygen layer are retained. Subsequently, gold with a thickness of 20-200 nm is sputtered on the front of the silicon wafer, and lithographic patterning is conducted, such that the gold forms the wire. In the process of preparing the plate, the plate needs to be thick enough to form a parallel electric field to provide the driving force for the fatigue test. Therefore, metal aluminum is sputtered repeatedly with a final sputtering thickness of 2-10 μm, and lithographic patterning is conducted, such that the aluminum forms the plate. Finally, a window of 30 μm×100 μm is lithographed at a front center of the silicon wafer, which penetrates the device layer and the buried oxygen layer, and an edge of the window is used to carry and place the 1D nanomaterial. The silicon wafer is cut into a 3 nm×3 nm square chip by laser scribing, which is carried on the supporting part disposed on the sample holder of the TEM, and the chip wire is connected to the external cable. The FIB technology is adopted. A single 1D nanomaterial with a diameter ranging from 50 to 1,000 nm and a length ranging from 10 to 80 μm is selected. One end is extracted and bonded to the short side of the chip window to form a cantilever structure parallel to the plate. A waveform generator is used as the power supply to apply a frequency controlled AC to the plate in the device, so as to realize the high-frequency vibration of the 1D nanomaterial. The microstructure evolution of the test material can be observed in situ during the fatigue test.

A method using the above in-situ fatigue test device includes the following steps.

(1) The 1D nanomaterial tested needs to be cleaned and dispersed. The to-be-tested material is repeatedly cleaned with pure water and organic solvents that do not react with the material. On the one hand, the concentration of a 1D nanomaterial solution is diluted, and on the other hand, the organic components on the material surface are removed. Then, a solution containing the to-be-tested material is dropped onto a copper mesh. Until the solvent is evaporated, the to-be-tested material is left on the copper mesh.

(2) The to-be-tested material that conforms to the size and morphology on the copper mesh is selected using an electron beam in a double beam microscope, and extracted from the copper mesh. Ion beam observation shall be avoided during material extraction.

(3) The to-be-tested material is transferred to the middle of the window of the device, with one end welded to the observation window and the other end free, such that the to-be-tested material forms a cantilever beam structure. In addition, the to-be-tested material shall be parallel to the plate and at the same distance from the two plates.

(4) The test device loaded with materials is installed on the sample holder of the TEM and inserted into the TEM. The sample is connected to the circuit after found through the observation window of the TEM. The two plates on the chip are connected to the positive and negative electrodes of the waveform generator respectively.

(5) Due to the different physical properties of the tested materials, the applied voltage and frequency need to be determined before starting the fatigue test. First, a unidirectional potential is applied to the two plates, and small to large potentials are gradually tried. In addition, the deflection of the sample in the TEM is observed, and a voltage range is 1 mV-10 V. The frequency range of AC is set from 1 Hz to 1 mHz in the waveform generator.

(6) During the fatigue test of the to-be-tested sample, a high-speed camera in the TEM is used to capture the vibration of the to-be-tested sample, and its maximum amplitude is the strain of the fatigue test.

(7) According to the test requirements, after enough fatigue cycles, the power supply is turned off, and the TEM is used to capture the evolution of the to-be-tested microstructure. The above fatigue test and microstructure observation are repeated to complete the test.

Advantages (1) This test method solves the problem that it is extremely difficult for traditional mechanical devices to test the mechanical fatigue performance of small-sized 1D nanomaterials, and develops a method that can test the mechanical fatigue performance of the 1D nanomaterials.

(2) The present disclosure breaks through the limitation that the traditional method can only observe the microstructure of the test sample ex situ, and can simultaneously realize fatigue performance measurement of the 1D nanowire and in-situ observation of the microstructure at the atomic scale.

(3) This test method can measure the fatigue performance of the 1D nanomaterials in conditions of long cycle and high frequency by using the electric field, which can make up for the shortcomings of previous mechanical devices.

(4) This test method is universal and can be used to test the fatigue performance of any kind of small-sized 1D nanomaterials. The size and morphology of the test materials can be controlled as required. The 1D nanomaterials include metals, semiconductors, nanowires, nanopillars, and nanotubes.

(5) This test device can be used repeatedly. Before each test, the samples from the previous test can be removed by using FIB.

Figure 1:
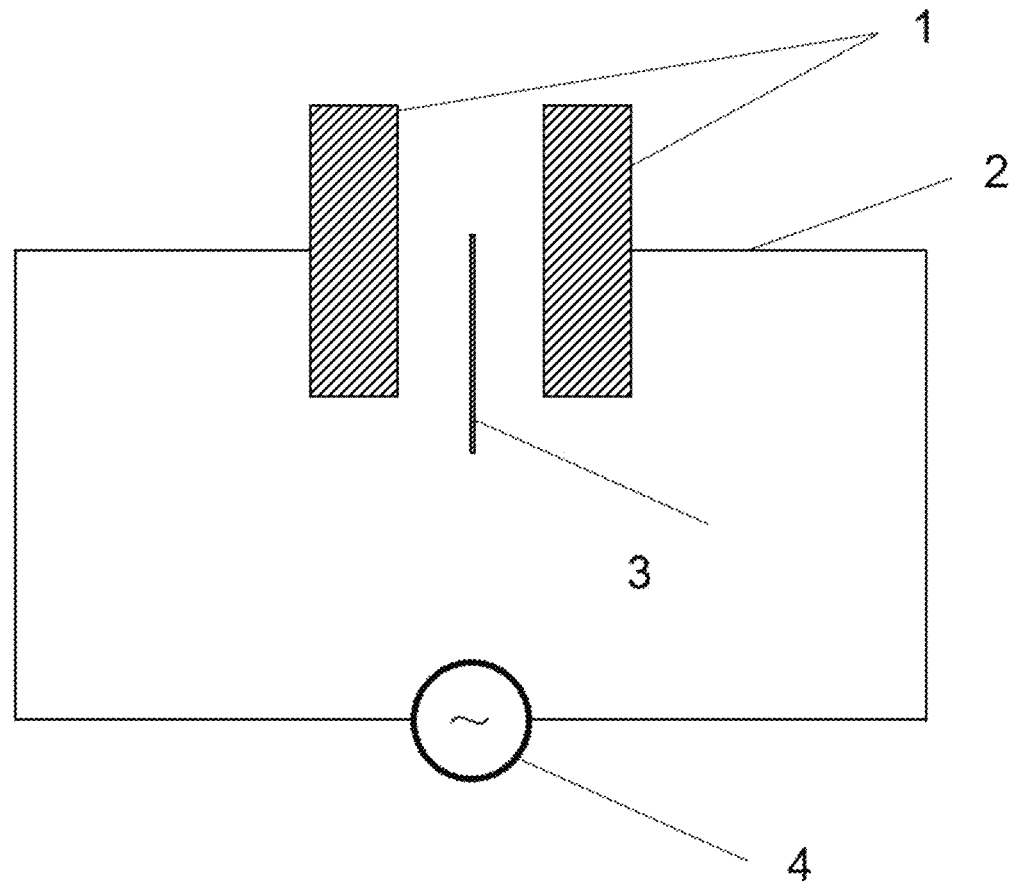
FIG. 1 is a circuit diagram of in-situ fatigue test device.

REFERENCE NUMERALS 1, plate; 2, wire; 3, to-be-tested material; and 4, voltage and frequency controlled alternating power supply.

DETAILED DESCRIPTION OF THE EMBODIMENTS

The specific implementations of this method are described in combination with the following drawings.

Figure 2:
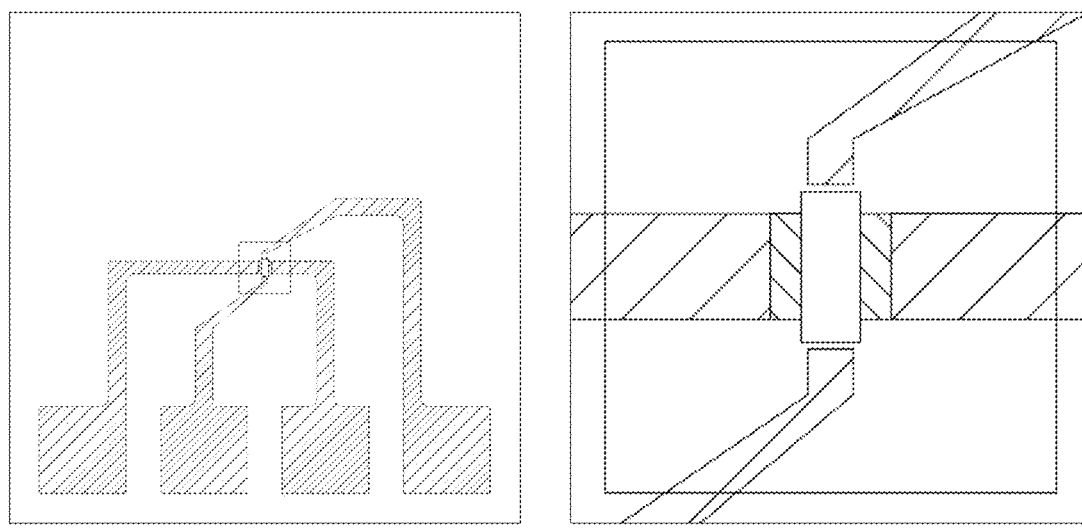
FIG. 2 is a planar graph of chip of in-situ fatigue test device.
Figure 3:
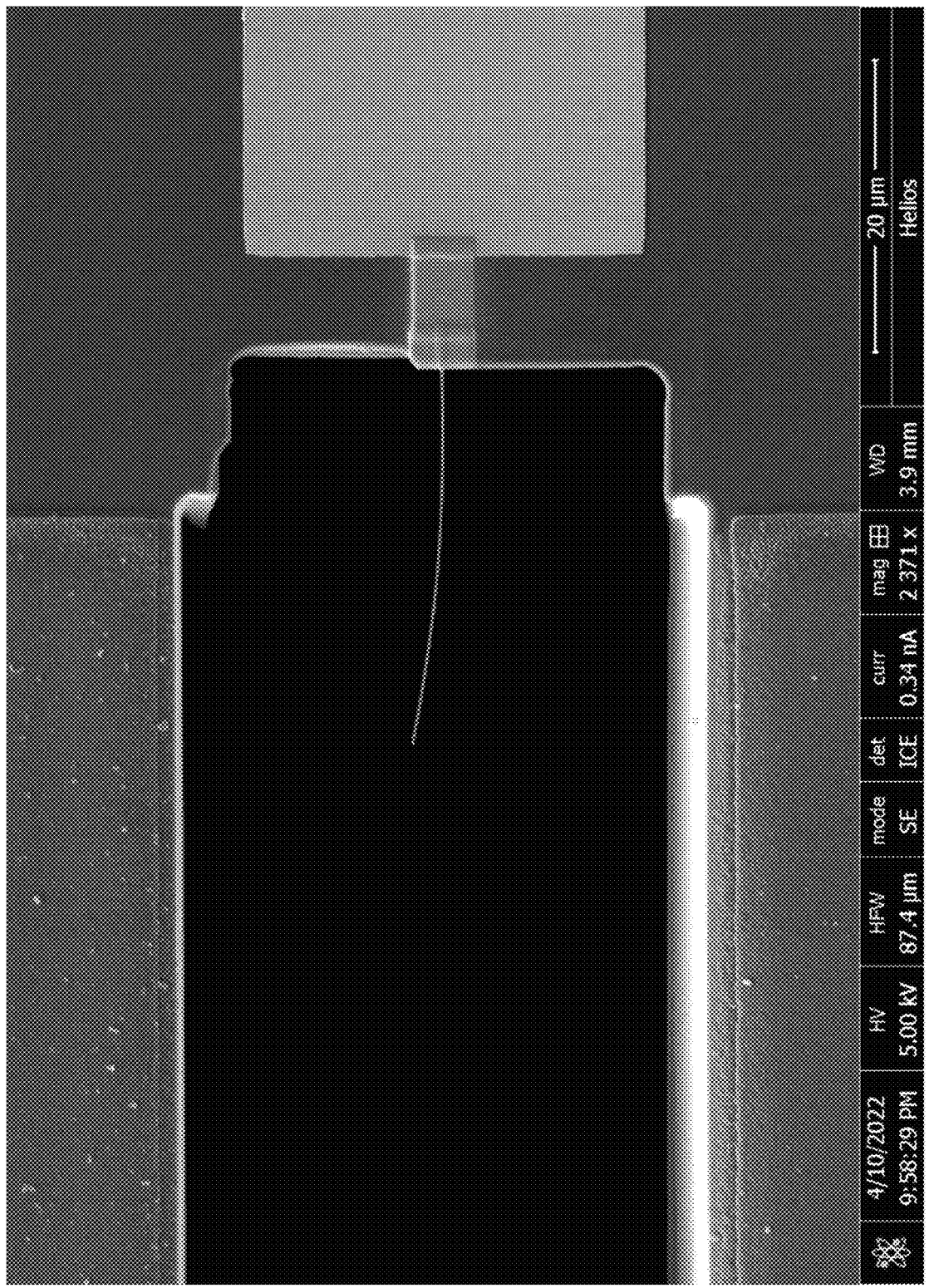
FIG. 3 is an FIB overlap diagram of to-be-tested materials.

An SOI wafer with a specification of 50-0.5-300 μm was selected, and subjected to thermal oxidation process to form a 200 nm $SiO_2$ layer on a surface. A front surface was protected and the oxide layer on the back surface of the silicon wafer was removed. Cr/Au with a thickness of 20 nm/200 nm and Al with a thickness of 2 μm were sputtered on the front of the silicon wafer, Au and Al were subjected to lithography and stripped and patterned to form the wires and plates of the chip. The front of the silicon wafer was subjected to dry etching for 50 μm to penetrate the wafer device layer. The back of the silicon wafer was subjected to wet etching for 350 μm to form the window for carrying samples. Finally, a 3 mm×3 mm single chip was prepared by laser scribing. The chip structure was shown in FIG. 1. The chip was bonded to the in-situ carrier of a sample holder of a TEM, and the wire and the external cable were welded together. Ag nanowires were synthesized, subjected to centrifugal separation with alcohol and acetic acid, and cleaned by ultrasound. An Ag nanowire solution was diluted with deionized water, dropped on the copper mesh, and air-dried. In the double beam microscope, a Φ100 nm×30 μm Ag nanowire was selected using a 5 kV/0.34 nA electron beam current, and was transferred to the device of the present disclosure using a tungsten needle, as shown in FIG. 3. The device was installed in a front section of the sample holder and loaded into the TEM. The cable lead out was connected to the waveform generator. The structure was shown in FIG. 2. The fatigue tests were carried out at different frequencies using an AC with a voltage of 300 mV, and the microstructure evolution under fatigue was observed in situ using the TEM.

What is claimed is:

1. A device for measuring a correlation between fatigue performance and a microstructure of a one-dimensional (1D) nanomaterial in situ in a transmission electron microscope (TEM), comprising: a chip part, a supporting part, and a control circuit, wherein the chip part comprises a P-type silicon-on-insulator (SOI) wafer, an insulating layer, a wire, a plate, and an observation window; the supporting part is a carrier disposed in a front section of a sample holder of the TEM, and is configured to carry the chip part and connecting cables; and the control circuit comprises a connecting line led out from the sample holder of the TEM and an external power supply.

2. The device according to claim 1, wherein the P-type SOI wafer comprises three layers: a surface silicon device layer, a middle buried oxygen layer, and a bottom silicon substrate layer; a thickness of the silicon device layer ranges from 10 to 100 μm; a thickness of the buried oxygen layer ranges from 100 to 1,000 nm; and a thickness of the silicon substrate layer ranges from 200 to 1,000 μm.

3. The device according to claim 1, wherein the insulating layer is a silicon dioxide insulating layer with a thickness of 100-1,000 nm formed on a surface of the silicon device layer on an upper layer of the SOI wafer using thermal oxidation process.

4. The device according to claim 1, wherein the wire is formed by metal sputtering on a surface of the insulating layer and lithographic stripping.

5. The device according to claim 1, wherein the chip plate is formed by metal sputtering on a surface of the insulating layer, has a thickness ranging from 2 to 10 μm, and is lithographically stripped to a minimum line width range of 10-100 μm.

6. The device according to claim 1, wherein the chip observation window is a rectangular through hole penetrating the SOI wafer in a thickness direction, and has a long side with a size equal to a length of the chip plate and a width range of 5-100 μm.

7. The device according to claim 1, wherein the connecting cables comprise an external cable connected to the chip and a cable connected to the sample holder of the TEM.

8. The device according to claim 1, wherein the to-be-tested material is a nanowire, nanopillar, or nanotube, is made of metal or a semiconductor, and has a diameter range of 10-200 nm and a length range of 10-100 μm.

9. A method using the device according to claim 1, comprising: carrying a to-be-tested material using a focused ion beam (FIB) microscope, wherein during transfer, an ion beam is not used for observation of a sample, so as to prevent damage to the to-be-tested material; and
    conducting an in-situ test in the TEM, applying a voltage with a required waveform, voltage, and frequency using the external power supply, and observing microstructure evolution of the sample under fatigue in situ.

\* \* \* \* \*